US006730606B1

(12) United States Patent
Azam et al.

(10) Patent No.: US 6,730,606 B1
(45) Date of Patent: May 4, 2004

(54) TRENCH GROWTH TECHNIQUES USING SELECTIVE EPITAXY

(75) Inventors: Misbahul Azam, Gilbert, AZ (US);
Jeffrey Pearse, Chandler, AZ (US);
Christopher J. Gass, Tempe, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 82 days.

(21) Appl. No.: 09/705,274

(22) Filed: Nov. 3, 2000

(51) Int. Cl.[7] .............................................. H01L 21/311
(52) U.S. Cl. ....................... 438/700; 438/701; 438/713; 438/717
(58) Field of Search ................................ 438/700, 701, 438/713, 717, 245, 270, 259

(56) References Cited

U.S. PATENT DOCUMENTS 5,013,680 A * 5/1991 Lowrey et al. ............. 438/242
6,150,708 A * 11/2000 Gardner et al. ............. 257/618
6,239,463 B1 * 5/2001 Williams et al. ............. 257/328
6,291,298 B1 * 9/2001 Williams et al. ............. 438/270
2001/0049167 A1 * 12/2001 Madson

* cited by examiner

*Primary Examiner*—W. David Coleman
*Assistant Examiner*—Kheim Nguyen

(57) ABSTRACT

A masking material (14) is formed on a foundation layer (12) and a substrate (10). A mask (16) is disposed onto the masking material (14) where a trench (26) is desired to be formed. An etch step removes all of the masking material (14) except at regions where the mask (16) was formed leaving a protruding portion (18) with an opening (20) on either side. An epi layer (24), is grown on the foundation layer (12) adjacent to the protruding portion (18) in the opening (20). A wet oxide etch process is used to remove the protruding portion (18) leaving a trench (26) formed in the epi layer (24). To complete the process, a silicon wet etch process is used to round off the corners at an edge (28) of the trench (26).

25 Claims, 3 Drawing Sheets

TRENCH GROWTH TECHNIQUES USING SELECTIVE EPITAXY

BACKGROUND OF THE INVENTION

The present invention relates in general to trench semiconductor devices and, more particularly, to methods of forming trenches in a semiconductor devices.

Trench semiconductor devices are used in many applications including power supplies, battery chargers, computers, and cell phones. During the process used to manufacture trench semiconductor devices a dry silicon etch step is used to form the trenches in a silicon material of the semiconductor device. However, the channel region inside the trench wall of the semiconductor device is frequently damaged and rough edges can be formed after the dry silicon etch step. The damage to the channel region can cause leakage which then causes reduced carrier lifetime in the channel area. Decreased carrier lifetime increases the voltage threshold thereby increasing the on-state resistance of the semiconductor device. There is conventional prior art cleaning processes used to reduce the damage to the trench wall of the semiconductor device, but is at the cost of extra process steps. However, the extra process steps used to remove the damage to the trench walls frequently does not completely anneal the trench walls leaving the damage to the channel region in the semiconductor device.

Furthermore, the trench depth of a semiconductor device is typically a critical dimension which is difficult to meet using the dry silicon etch process. or example, a trench power MOSFET device should have the trench depth just below the diffused body region to minimize the gate to drain capacitance and minimize the gate oxide electric field strength.

Accordingly, it is desirable to have a manufacturing process to form trenches in a semiconductor device without causing damage to the trench. Further, it is desirable to have the manufacturing process provide an accurate alignment of the trench bottom to specific dopant distribution during the process steps. The invention disclosed herein will address the above problems.

DETAILED DESCRIPTION OF THE DRAWINGS

Figure 1:
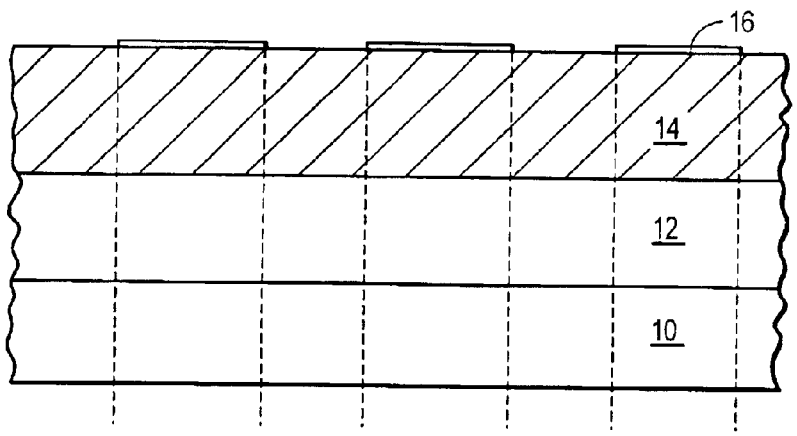
FIG. 1 is a cross-sectional view of a semiconductor device in a manufacturing step illustrating a masking step.

FIG. 1 illustrates a cross-sectional view of a semiconductor device in a process step of a manufacturing process. FIG. 1 can be a metal oxide semiconductor field effect transistor (MOSFET) or an insulated gate bipolar transistor (IGBT). It will be apparent to someone skilled in the art that the process disclosed herein can be used to manufacture any one of these semiconductor devices. The method of making an n-channel MOSFET device is disclosed herein to illustrate the preferred process.

However, the process can easily be used to make a p-channel MOSFET device.

Figure 2:
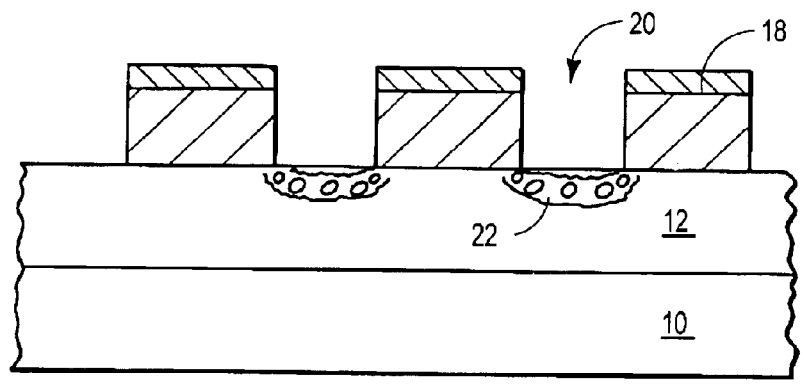
FIG. 2 is a cross-sectional view of the semiconductor device in the manufacturing step after an etching step.

A typical n-channel MOSFET semiconductor device shown in FIG. 1 includes foundation layer 12 grown on substrate 10. Foundation layer 12 is typically a lightly doped n-type silicon of typically $5 \times 10^{16}$ atoms per $cm^3$ with dimensions in the range of five to fifty microns in thickness. Dimensions are determined for foundation layer 12 based on application. A thick layer ranging from twenty to thirty microns is typically used for foundation layer 12 for high voltage applications, where as a smaller thickness is used for low voltage applications. Substrate 10 is typically a highly doped n-type substrate of arsenic or phosphorous. A first layer, masking material 14, is grown on foundation layer 12. Masking material 14 is typically an oxide material, i.e. silicon dioxide, grown using a thermal oxide or can be deposited. A nitride material can also be used for masking material 14. Mask 16 is formed on masking material 14 where a trench is desired in the semiconductor device. Any typical photoresist material known to someone skilled in the art can be used for mask 16. An etch step is used to remove portions of masking material 14 where mask 16 is not formed leaving protruding portion 18 as shown in FIG. 2. Protruding portion 18 is a protruding portion of masking material 14 remaining after the etch step. Thus, protruding portion 18 will be made of a material of either silicon dioxide or nitride.

A dry etch process or any other similar process known to those skilled in the art is used in the etch step to remove portions of masking material 14. During this point in the process, an implant, implant 22, can be formed in foundation layer 12 at opening 20 shown in FIG. 2. Typically, implant 22 added at this point in the process is used for an IGBT device. An IGBT semiconductor device typically has a very low resistance, and as such turns off slowly. Adding implant 22 can modify and improve the turn-off of the IGBT semiconductor device. Implant 22 is formed in foundation layer 12. Implant 22 would typically be titanium or germanium. For an IGBT, foundation layer 12 would be a lightly doped n-type region.

Figure 3:
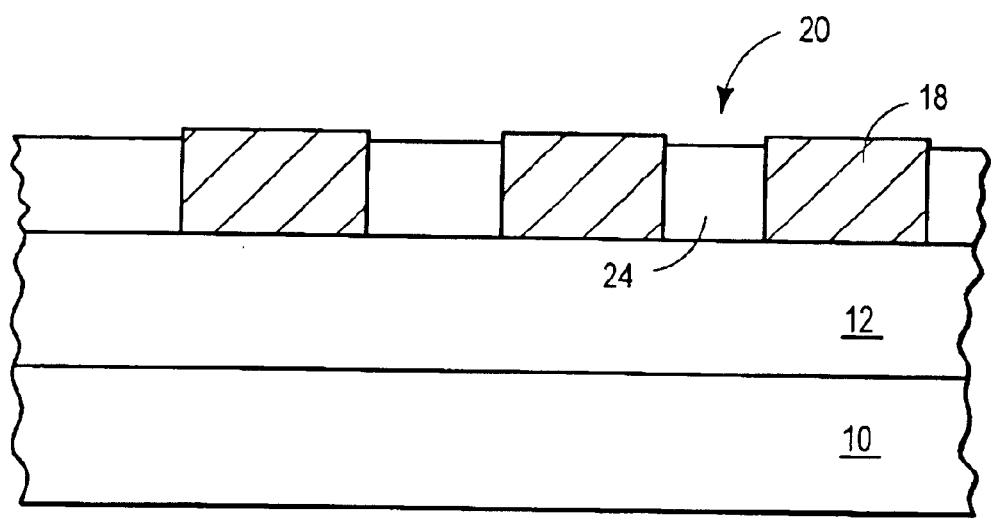
FIG. 3 is a cross-sectional view of the semiconductor device in the manufacturing step illustrating a blanket epi growth technique.

A second layer, epi layer 24, is grown on foundation layer 12 adjacent to protruding portion 18 at opening 20 as shown in FIG. 3. Epi layer 24 is typically lightly doped p-type silicon of approximinatly $5 \times 10^{17}$ atoms per $cm^3$. The growth of epi layer 24 is temperature controlled so that the layer only grows vertically above foundation layer 12 and not over protruding portion 18. For example, if foundation layer 12 is silicon and protruding portion 18 is oxide, the growth of epi layer 24 will only grow vertically where the silicon is exposed, and not where the oxide is exposed. Thus, epi layer 24 does not nucleate over the oxide material of protruding portion 18. The growth technique typically used to grow epi layer 24 is a selective epitaxial growth (SEC) process which is commonly known to someone skilled in the art. A cleaning polishing step is typically done after the SEG step to further smooth the surfaces of epi layer 24 and protruding portion 18.

Figure 4:
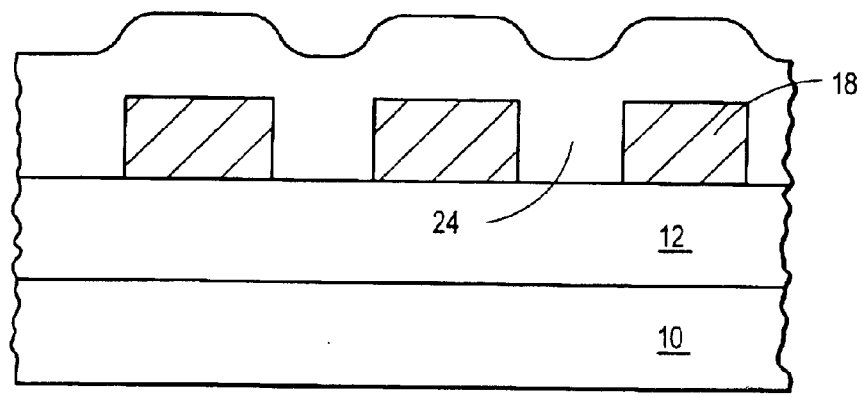
FIG. 4 is a cross-sectional view of the semiconductor device in the manufacturing step illustrating a selective epi growth technique.

An alternative to the SEG technique, is a blanket epitaxial growth (BEG) process which grows epi layer 24 as shown in FIG. 4. Epi layer 24 is grown over foundation layer 12 and protruding portion 18 using BEG. Epi layer 24 of FIG. 4 is polished back to ensure that protruding portion 18 is planarized with epi layer 24 as shown in FIG. 3. A polish step common to someone skilled in the art is chemical or mechanical polish (CMP). The BEG process grows an amorphous material such as a polysilicon material over protruding portion 18 and a crystalline material such as silicon over the exposed portions of foundation layer 12.

Figure 5:
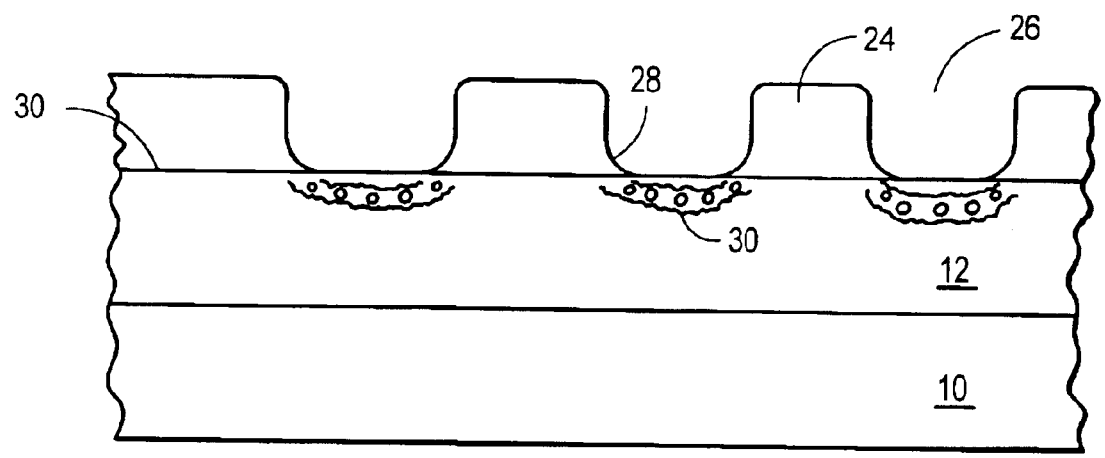
FIG. 5 is a cross-sectional view of a plurality of trenches in the semiconductor device.

After the growth technique and polish step described above is completed, a non-damaging mask removal is used to remove protruding portion 18. Typically, the non-damaging mask removal technique is a wet oxide etch process. The wet oxide etch process is commonly known to someone skilled in the art as having a good selectivity between oxide and silicon material. Thus, the wet oxide etch process is used to remove protruding portion 18 to form trench 26 as shown in FIG. 5. The resulting trench 26 typically has squared corners at the junction to epi layer 24 and foundation layer 12. A silicon wet etch process is used to round off the corners at edge 28 of trench 26 shown in FIG. 5. Any other suitable wet etch process can be used to round off the corners as will be appreciated to someone skilled in the art. At this point in the process implant 30 can be formed below trench 26 in foundation layer 12 as shown in FIG. 5. Implant 30 will typically be formed below trench 26 when making a MOSFET semiconductor device. The MOSFET semiconductor device has two parameters which can be modified using implants below the trench of the MOSFET. Namely, a lower device resistance, and an increase in the breakdown voltage. The device resistance can be reduced in a MOSFET semiconductor device by adding, for example, a phosphorous implant for implant 30. To raise the breakdown voltage of a MOSFET semiconductor device an implant of, for example, boron can be used for implant 30. The use of the above implants is typically known to someone skilled in the art, and is shown to illustrate the ease of using implants with the technique disclosed herein.

Figure 6:
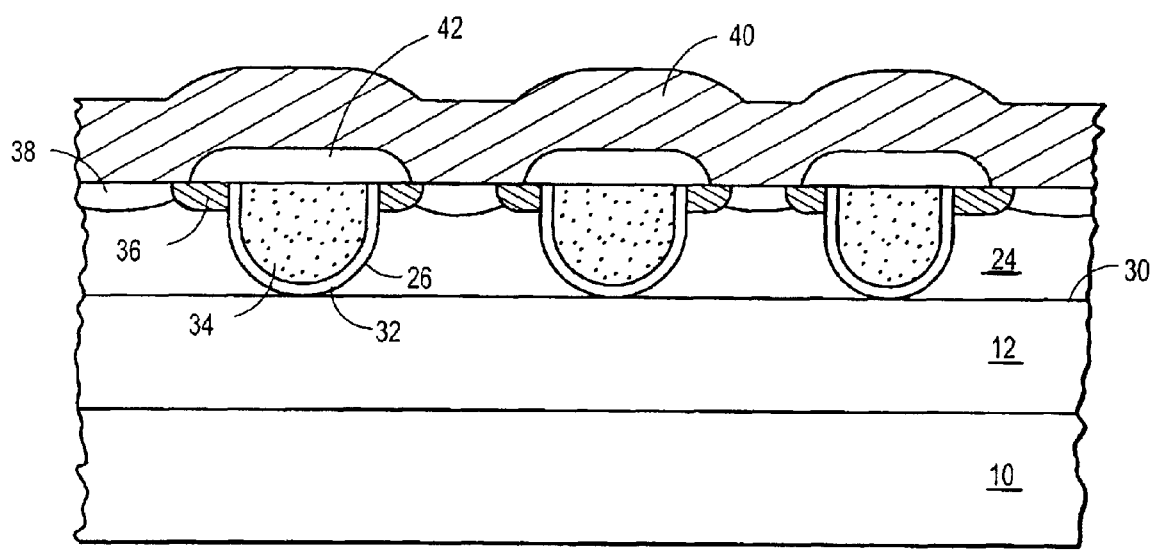
FIG. 6 is a cross-sectional view of a semiconductor device in the final stage of manufacturing using the process disclosed herein.

FIG. 6 illustrates a complete MOSFET semiconductor device formed using the above process. Once trench 26 is formed using the process, gate oxide layer 32 is disposed within trench 26. Gate oxide layer 32 is typically one to three hundered Angstroms in thickness. Gate structure 34 is disposed above gate oxide layer 32 within trench 26. Gate structure 34 is typically formed from a highly doped polysilicon with phosphorus of typically $2 \times 10^{19}$ to $3 \times 10^{19}$ atoms per $cm^3$. Source region 36 is typically a heavily doped n-type region formed within epi layer 24 adjacent to trench 26. Source region 36 is typically a shallow region of two tenths um in thickness. A typical dopant for source region 36 is an n-type arsenic doped region. Epi layer 24 further includes doped region 38 which is a heavily doped p-type region extending from the surface of epi layer 24. Doped region 38 typically has a higher doping concentration than epi layer 24. Doped region 38 is typically formed to a depth of two to five tenths um and provides a low contact resistance between metal electrode layer 40 and epi layer 24. A typical dopant for doped region 38 is boron. ILD layer 42 is disposed on the top surface of epi layer 24 above gate structure 34 and source region 36. ILD layer 42 is typically silicon dioxide of approximately five thousand angtroms, and provides an isolation between metal electrode layer 40 and gate structure 34. Metal electrode layer 40 is formed above ILD layer 42 and on the top surface of epi layer 24 to provide a low resistive contact to source region 36 and doped region 38. Metal electrode layer 40 is typically an aluminum material.

It should be apparent to someone skilled in the art that the above process automatically aligns the depth of trench 26 to major surface 30 of foundation layer 12 as shown in FIG. 5. Prior art methods do not allow for an easy alignment of a trench and an epitaxial layer of a semiconductor device. The trench of a semiconductor device can be cut either too deep or too shallow. The process described herein provides a way to control the trench depth to avoid this problem. For example, in a power MOSFET device the optimum depth of a trench is at the interface between foundation layer 12 and masking material 14 as shown in FIG. 1. If the depth is too shallow the power MOSFET device will not work since no channel is formed, and if the depth is too deep, i.e. to far into foundation layer 12, the device will experience breakdown problems.

The following is an example in using the above described process. For example, it is desired to form a one micron deep trench for trench 26 using a five micron thick foundation layer 12 to form the epitaxial layer of the semiconductor device. In the prior art, the dry etch process would be used to form the one micron deep trench in a five micron thick epitaxial layer by removing a one micron deep section of material from the five micron thick epitaxial layer. The prior art process produces two problems. First, the trench depth is difficult to control, and secondly, the resulting trench walls become damaged from the dry etch process. The process described herein mediates the above described problems in forming trench semiconductor devices. To form the same one micron deep trench, the process described herein starts with a four micron thick, for example, lightly doped n-type foundation layer 12. A one micron thick masking material 14, for example, silicon dioxide is grown on the four micron thick foundation layer 12. Mask 16 is formed on masking material 14 using photoresist at regions where a trench is desired as shown in FIG. 1. An etch step removes all of masking material 14 except at regions where mask 16 were formed. The etch step leaves a one micron thick protruding portion 18 as shown in FIG. 2. A dry etch process or any other type of process to those skilled in the art is used in the etch step. A one micron thick epi layer 24, using silicon for example, is grown on foundation layer 12 adjacent to protruding portion 18 at opening 20 as shown in FIG. 3. Epi layer 24 is grown using either the SEG or BEG process as described previously, and is typically well known to someone skilled in the art. The SEG process results in a one micron thick growth of silicon for epi layer 24. The BEG process requires a CMP to polish back epi layer 24 to planarize it with protruding portion 18 to form a one micron thick epi layer 24.

A wet oxide etch process is used to remove the one micron thick lightly doped n-type protruding portion 18, and leaving the one micron thick epi layer 24 of silicon. The wet oxide etch process is common to those skilled in the art. Thus, the etch process is not limited to the process described herein, and any other type of process can easily be used. The wet oxide etch process leaves a one micron deep trench 26 within the silicon of epi layer 24 as shown in FIG. 5. To complete the process, a silicon wet etch process is used to round off the corners shown in FIG. 5 at edge 28 of the one micron deep trench 26. The remaining process steps to complete the semiconductor device shown in FIG. 6 is known to someone skilled in the art.

Thus, the method of forming a trench in a semiconductor device described herein provides a process to form a trench without causing damage to the trench walls. The prior art processes typically cause trench wall damage by etching out the desired trench, where the process described herein builds the trench thereby eliminating trench wall damage. Further, the disclosed process provides accurate alignment of the trench bottom to specific dopant distributions formed in a semiconductor device.

What is claimed is:

1. A method of forming a trench in a semiconductor device, comprising;

disposing a masking material on the semiconductor device;

forming a protruding portion at a location of the trench by forming an opening in the masking material adjacent to the location of the trench;

depositing a semiconductor material to fill in the opening;

removing the protruding portion to form the trench; and etching the semiconductor material to round off corners of the trench.

2. The method of claim 1, further including:

providing a substrate supporting the masking material; and forming a first epi layer between the substrate and the masking material.

3. The method of claim 1, wherein the semiconductor material is an epitaxial material.

4. The method of claim 1, further including the step of forming a mask at the location of the trench after disposing the masking material.

5. The method of claim 4, wherein forming the protruding portion further includes performing an etch step to remove the masking material where the mask is absent to form the opening.

6. The method of claim 1, wherein depositing the semiconductor material includes using a selective epi growth process to fill in the opening.

7. The method of claim 1, wherein depositing the semiconductor material includes using a blanket epi growth process to deposit the semiconductor material over the protruding portion and in the opening.

8. The method of claim 1, wherein removing the protruding portion step is a non-damaging mask removal step.

9. A method of forming a trench in a semiconductor device, comprising:

providing a substrate for the semiconductor device;

forming a first epi layer above the substrate and having a major surface;

forming a protruding region on the first epi layer having an opening adjacent to the protruding region and exposing the major surface of the first epi layer;

forming a second epi layer within the opening adjacent to the protruding region;

removing the protruding region to form the trench within the second epi layer aligned with the major surface of the first epi layer of the semiconductor device; and etching the second epi layer to round off corners of the trench.

10. The method of claim 9, further including before forming the protruding region, forming a masking material above the first epi layer.

11. The method of claim 10, further including forming a mask on the masking material at a location for the trench.

12. The method of claim 11, wherein the mask is a photoresist material.

13. The method of claim 11, wherein forming the protruding region further includes performing an etch step to remove the masking material where the mask is absent to form the opening.

14. The method of claim 9, wherein forming the second epi layer includes using a selective epi growth process.

15. The method of claim 9, wherein forming the second epi layer further includes forming the second epi layer over the protruding region.

16. The method of claim 15, wherein forming the second epi layer over the protruding region includes using a blanket epi growth process.

17. A method of forming a trench in a semiconductor device, comprising;

disposing a first material on the semiconductor device;

forming first and second openings in the first material to form a protruding region;

disposing a second material in the first and second openings;

removing the protruding region to form the trench; and etching the second material to round off corners of the trench.

18. The method of claim 17, further including:

forming a substrate below the first material; and forming an epi layer between the substrate and the first material.

19. The method of claim 17, wherein the first material is a masking material from a group consisting of silicon dioxide and silicon nitride.

20. The method of claim 17, wherein the second material is an epitaxial material comprised of silicon.

21. The method of claim 17, further including foaming a mask on the first material after disposing the first material.

22. The method of claim 21, wherein forming the first and second openings includes performing an etch step to remove the first material adjacent to the mask.

23. The method of claim 17, wherein disposing the second material includes using a selective epi growth process.

24. The method of claim 17, wherein disposing the second material further includes disposing the second material over the protruding region.

25. The method of claim 24, wherein disposing the second material over the protruding region includes using a blanket epi growth process.

* * * * *